United States Patent [19]

Salerno et al.

[11] Patent Number: 4,826,784

[45] Date of Patent: May 2, 1989

[54] SELECTIVE OMCVD GROWTH OF COMPOUND SEMICONDUCTOR MATERIALS ON SILICON SUBSTRATES

[75] Inventors: Jack P. Salerno, Waban; Jhang W. Lee, Mansfield; Richard E. McCullough, Wrentham, all of Mass.

[73] Assignee: Kopin Corporation, Taunton, Mass.

[21] Appl. No.: 120,018

[22] Filed: Nov. 13, 1987

[51] Int. Cl.$^4$ .................... H01L 21/205; H01L 7/36
[52] U.S. Cl. .................... 437/89; 148/DIG. 26; 148/DIG. 29; 148/DIG. 72; 148/DIG. 110; 148/DIG. 169; 148/DIG. 57; 148/33.2; 156/613; 437/90; 437/126; 437/132; 437/939; 437/946
[58] Field of Search ............. 148/DIG. 26, 29, 50, 148/57, 56, 65, 72, 97, 110, 127, 150, 152, 169, 33.2; 156/610–615; 437/89, 90, 84, 88, 99, 104, 107, 126, 132, 133, 939, 946, 970

[56] References Cited

U.S. PATENT DOCUMENTS

| | | | |
|---|---|---|---|
| 4,264,374 | 4/1981 | Beyer et al. | 437/225 |
| 4,371,421 | 2/1983 | Fan et al. | 437/89 |
| 4,551,394 | 11/1985 | Betsch et al. | 437/132 |
| 4,561,916 | 12/1985 | Akiyama et al. | 437/126 |
| 4,579,609 | 4/1986 | Reif et al. | 437/946 |
| 4,587,717 | 5/1986 | Daniele et al. | 437/127 |
| 4,588,451 | 5/1986 | Vernon | 437/126 |
| 4,657,603 | 4/1987 | Kruehler et al. | 437/132 |

FOREIGN PATENT DOCUMENTS

| | | | |
|---|---|---|---|
| 0018437 | 2/1981 | Japan | 437/946 |
| 0024540 | 2/1982 | Japan | 437/946 |
| 0924776 | 4/1982 | Japan | 437/946 |
| 0096738 | 5/1986 | Japan | 437/946 |

OTHER PUBLICATIONS

Choi et al., "Monolithic Integration of Si and GaAs Devices", Mat. Res. Soc. Symp. Proc., vol. 67, 1986, pp. 165-171.
Turner et al., "High Speed Photoconductive Detectors Fabricated in Heteroepitaxial GaAs Layers," Mat. Res. Soc. Symp. Proc., vol. 67, 1986, pp. 181-188.
Tsang, "Selective Area Growth of GaAs ... by Chemical Beam Epitaxy ... ", Appl. Phys. Lett., vol. 46, No. 8, Apr. 15, 1985, pp. 742-744.
Wolf et al., Silicon Processing for the VLSI Era, Lattice Press, Sunset Beach, CA, Sep. 1, 1986, pp. 516-518.
Hong et al., "Summary Abstract: Selective-Area Epitaxy of GaAs ... by Molecular Beam Epitoxy", J. Vac. Sci. Technol. B 4(2), Mar./Apr. 1986, pp. 629-630.
Bedair et al., "Laser Selective Deposition of GaAs on Si", Appl. Phys. Lett., vol. 48, No. 2, Jan. 13, 1986, pp. 174-176.
Li et al., "Aspects of GaAs Selective Area Growth by Molecular Beam Epitaxy ... " J. Electrochem. Soc., vol. 130, No. 10, Oct. 1983, pp. 2072-2075.
Soga et al., "Selective MOCVD Growth of GaAs on Si Substrate ... ", Japanese J. Appl. Phys., vol. 26, No. 2, Feb. 1987, pp. 252-255.
Chaudhury et al., "Selective Growth of Epitaxial Silicon and Gallium Arsenide", J. Electrochem. Soc., vol. 118, No. 1, Jan. 1971, pp. 107-110.
"Monolithic Integration of GaAs Light-Emitting Diodes and Si Metal-Oxide-Semiconductor Field-Effect Transistors", Ghosh et al., Appl. Phys. Lett. 48(5): 370-371 (Feb. 3, 1986).
"GaAs Light Emitting Diodes Fabricated on SiO$_2$/Si Wafers", Shinoda et al., Japanese Journal of Applied Physics, 22 (7): L450-L451 (Jul. 1983).
"GaAs Light-Emitting Diodes Fabricated on Ge--Coated Si Substrates", Fletcher et al., Appl. Phys. Lett. 44(10) (May 15, 1984).
"AlGaAs Double-Heterostructure Diode Lasers Fabricated on a Monolithic GaAs/Si Substrate", Windhorn et al., Appl. Phys. Lett. 45(4), Aug. 15, 1984.
"Lateral Eqitaxial Overgrowth of GaAs and GaSlAs Organometallic Chemical Vapor Deposition", Gale et al., Institute of Physics Conference, Ser. No. 65: Ch. 2: 101-108 (1982).

Primary Examiner—Brian E. Hearn
Assistant Examiner—William Bunch
Attorney, Agent, or Firm—Hamilton, Brook, Smith & Reynolds

[57] ABSTRACT

A method of OMCVD heteroepitaxy of III/V (GaAs) material on a patterned Si substrate is described wherein heteroepitaxy deposition occurs only on the exposed Si surfaces and nowhere else.

12 Claims, 2 Drawing Sheets

SELECTIVE EPI ON PLANAR SUBSTRATE SURFACE

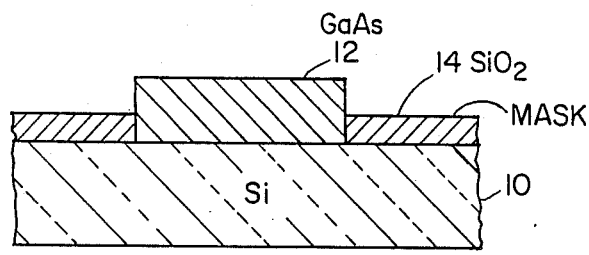
SELECTIVE EPI ON PLANAR SUBSTRATE SURFACE
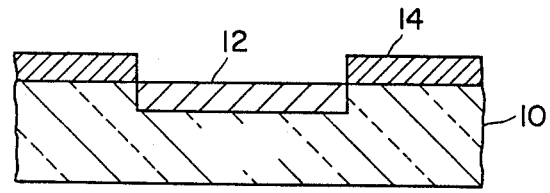
SELECTIVE EPI ON RECESSED SUBSTRATE SURFACE
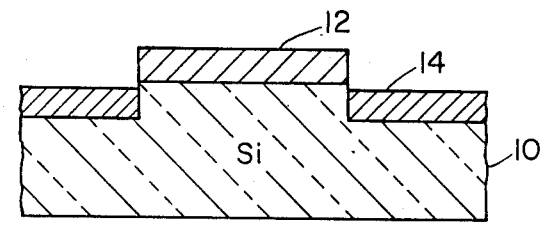
SELECTIVE EPI ON MESA SUBSTRATE SURFACE
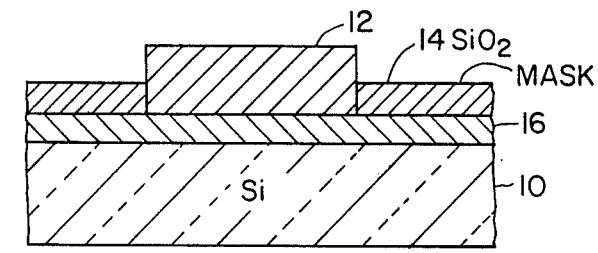
SELECTIVE EPI ON EPI SURFACE

SELECTIVE OMCVD GROWTH OF COMPOUND SEMICONDUCTOR MATERIALS ON SILICON SUBSTRATES

RELATED U.S. APPLICATIONS

"Optoelectronic Interconnections for III-V Devices on Silicon" by Paul M. Zavracky, Matthew M. Zavracky, John C. C. Fan and Jack P. Salerno, Ser. No. 120,021, filed Nov. 13, 1987.

BACKGROUND ART

Monolithic integration of compound semiconductor (Group III-V or II-VI) devices and silicon (Si) devices on a common Si substrate has the potential for achieving very substantial improvements in the performance of Very Large Scale Integrated (VLSI) circuits. In particular, monolithic integration of a gallium arsenide (GaAs) compound semiconductor device and silicon (Si) devices on a common substrate enhances capabilities of the VLSI circuit by combining the performance of silicon circuits with gallium arsenide and/or aluminum gallium arsenide optoelectronic components and high speed gallium arsenide and/or aluminum gallium arsenide circuits.

For example, the through-put of a silicon VLSI system may be considerably increased by integrating high-speed gallium arsenide input and/or output circuits, signal processing units and/or cache memory devices. As another example, gallium arsenide/aluminum gallium arsenide optoelectronic interface units may provide high-data-rate optical links to replace wire interconnects between silicon VLSI subsystems.

While there exists a 4% lattice mismatch between gallium arsenide and silicon, device-quality gallium arsenide layers have been grown on silicon substrates by both molecular beam epitaxy (MBE) and organometallic chemical vapor deposition (OMCVD). For true monolithic integration, however, it is necessary to fabricate both gallium arsenide and silicon devices on the same wafer or substrate. To achieve this goal, a method for selectively depositing III-V materials on silicon substrates would be highly desirable.

DISCLOSURE OF THE INVENTION

The present invention relates, in general, to a method for depositing compound semiconductor III-V or II-VI material on silicon substrates. The III-V material is preferably gallium arsenide or alloys of gallium arsenides, such as aluminum gallium arsenide. The II-VI material may comprise cadmium telluride or zinc selenide. For ease in description, gallium arsenide is used in the process description, however, it should be understood that references hereafter to gallium arsenide are intended to also encompass aluminum gallium arsenide or other gallium arsenide metal alloys, as well as gallium arsenide itself, unless otherwise indicated.

The method of the invention comprises, in general, the following steps:

The starting substrate is a virgin single crystal Si wafer, or a Si wafer with Si circuitry formed thereon in selected areas. A dielectric mask layer of $SiO_2$ and/or $Si_3N_4$ is then formed on the Si surface. The $SiO_2$ oxide mask may be formed by chemical vapor deposition (CVD), sputtering, or dry or wet thermal oxidation. The $Si_3N_4$ may be formed by propolytic reaction, sputtering, or plasma-assisted CVD. For clarity reasons, only the $SiO_2$ dielectric layer is described. The $SiO_2$ is selectively removed from areas where the GaAs is to be formed. The wafer, thus processed, is cleaned in a fashion so as to remove all impurities from the surface of the dielectric mask. This is a crucial step in that any remaining impurities, particularly metallic contaminants, will nucleate the deposition of polycrystalline GaAs on the mask surface. Residual oxide is removed from the exposed Si surface by a rinse solution while retaining the integrity of the remaining $SiO_2$ mask layer. This is also a critical procedure in that residual contamination of the Si surface can result in deposition of non-epitaxial GaAs. After drying, the wafers are ready for selective GaAs growth.

The patterned $SiO_2$ mask/Si wafer is subjected to a purge gas or an evacuated deposition chamber and then heated in a flowing $H_2$/Arsine ambient as an added surface treatment of the exposed Si surface.

Next a thin nucleation layer of epitaxial GaAs is deposited on the structure by the OMCVD process using trimethyl gallium (TMG) and arsine as the reactants. The GaAs layer is selectively formed only on the exposed Si surface and does not form on the oxide mask surfaces. The temperature is elevated from that used in depositing the nucleating layer and GaAs is deposited over the nucleating layer until the desired thickness is reached.

DETAILED DESCRIPTION OF THE DRAWINGS

FIGS. 1a–d are schematic cross-sections illustrating various selective epitaxial deposition options.

Figure 2A:
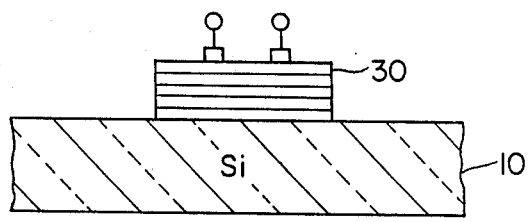
Figure 2B:
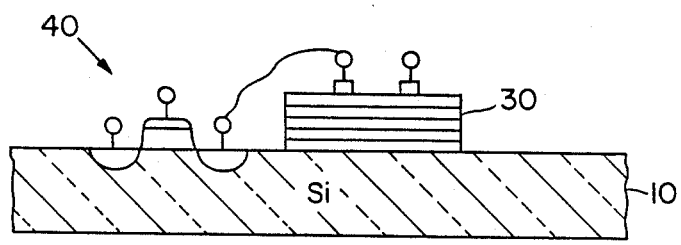
Figure 2C:
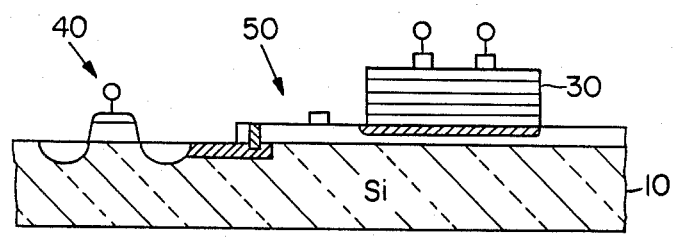

FIGS. 2a–c are schematic cross-sections illustrating various devices formed on substrates.

DETAILED DESCRIPTION OF THE INVENTION

The following is a step-by-step description of the process of the invention.

1. Formation of selective area regions on Si substrate:
   (a) Start with a virgin Si wafer, or a Si wafer with Si circuitry prefabricated in specific areas.
   (b) Form a mask layer on the Si wafer. While there are various options for materials and deposition techniques, the preferred process is to form the mask by a CVD process to produce nominally 0.2 microns of $SiO_2$ on the Si surface.
   (c) Apply photoresist and expose the oxide mask pattern consistent with the desired positions of the GaAs selective epitaxy locations.
   (d) Use the developed and fully processed photoresist as a mask to selectively remove $SiO_2$ from the Si surface where selective epitaxy is desired. A hydrofluoric acid solution (1 HF: $1H_2O$) is preferably used for the removal process.
   (e) Remove the photoresist using an appropriate solvent (typically acetone).
2. Si Wafer Cleaning Prior to Epitaxy
   (a) The patterned wafer is immersed in a solution intended to remove all residual contamination from the surfaces of both the oxide mask and exposed Si. In particular, it is necessary to remove metallic contamination from the oxide surface because clusters of metal atoms serve as sites for heterogenous nucleation of GaAs deposition during the epitaxy process. This will cause polycrystalline GaAs to deposit on the oxide surface. Such impurities can also interfere with the deposition of the epitaxial GaAs on the exposed Si surface. A typical solution for this procedure is a sulfuric acid solution (1H$_2$SO$_4$: 1H$_2$O$_2$.

(b) Rinse in H$_2$O.

(c) Immerse the wafer in a solution to remove residual oxide from the exposed Si surface. The presence of residual oxide on the Si surface will result in non-epitaxial GaAs deposition on the Si surface. A typical solution for this procedure is a hydrofluoric acid solution (1 HF: 1OH$_2$O).

(d) Dry the wafers. Optionally the wafers may be rinsed in an H$_2$O prior to drying.

(e) Where applicable, store in inert (N$_2$) environment until next step.

3. Selective Growth (a) Load the patterned wafer into an inert gas purged (N$_2$ or H$_2$) environment or evacuated deposition chamber.

(b) Purge or evacuate to obtain a pure H$_2$ ambient. Adjust the ambient pressure to nominally 100 Torr. (Optimal process pressure ranges from 10 to 100 Torr.)

(c) Ramp the temperature of the wafer from load condition (room ambient temperature) to 775° C. This process serves as a final clean off of the exposed Si surface and may cause a reconstruction of the atomic arrangement on the surface that promotes growth of high quality GaAs.

(d) Cool the wafer to a temperature of approximately 420° C. and initiate GaAs growth. This process is performed with the wafer temperature between 350° and 450° C. During this process GaAs is selectively epitaxially nucleated on the exposed Si surface but no deposition occurs on the SiO$_2$ surface. This step is continued until complete coverage of the Si by GaAs is achieved.

(e) Raise the temperature to between 600° and 700° C. to obtain epitaxial GaAs deposition at typical growth rates (nominally 4 um/hr.) and under conventional conditions as for homoepitaxial GaAs deposition.

(f) Optionally, additional steps can be included to effect defect and stress reduction.

The above process sequence has been used to demonstrate selective epitaxy of GaAs on Si substrates using OMCVD. This is somewhat of an unexpected observation in that prior experience with OMCVD at atmospheric pressures (approx. 760 Torr) has not achieved selective epitaxial growth. The goal of selective epitaxy is to obtain heteroepitaxial GaAs deposition only on the areas of exposed Si and no deposition on the oxide surface. Both MBE and atmospheric pressure OMCVD processes result in epitaxial GaAs deposition on the Si surface but a polycrystalline coating on the SiO$_2$. The claimed process combines (1) proper dielectric mask formation; (2) proper cleaning to remove all foreign matter and (3) the requisite process conditions for OMCVD selective epitaxy. The growth conditions are such that the pressure, temperature, and ratio of the group V and group III sources are such at that the group III atoms are sufficiently mobile to migrate along the wafer surface until they confront the epitaxial GaAs single-crystal matrix. This requires a pressure in the range of 10 to 100 Torr, heteroepitaxial nucleation at 350° to 450° C., continued growth at 600° to 700° C., and a sufficiently excessive arsine flow to prevent clustering of the Ga atoms. The preferable V/III source ratio for achieving this latter condition is greater than 10.

The nature of the selective epitaxy can be stipulated by the engineered configuration of the Si substrate surface and masking material geometry. Patterns can be formed by the arrangement of the masking material laterally across the Si wafer surface. Additionally, as shown in FIG. 1, the surface of the Si wafer 10 can be varied in a vertical direction to facilitate the formation of the III-V (or other deposited material) layer at a chosen position relative to the Si wafer surface. FIG. 1a shows selective epitaxy of GaAs 12 on Si 10 in openings formed in a SiO$_2$ mask 14. FIG. 1b shows selective epitaxy of GaAs 12 on a recessed surface of substrate 10, through openings in the SiO$_2$ mask. In this process, when the mask 14 is removed, by etching, the resultant structure is planar. FIG. 1c shows selective GaAs epitaxy on a mesa substrate surface. FIG. 1d shows the selective epitaxy of GaAs 12 on a blanket deposition of GaAs 16 on an unpatterned Si substrate. In this case the selective epitaxy mask 14 is formed on the surface of the GaAs 16 after the blanket deposition process. These configurations are of consequence for the implementation of device and circuit structures.

FIG. 2 schematically illustrates the implementation of device and circuit structures through selective epitaxy of III-V (or other materials) by selective epitaxy on Si substrates 10. FIGS. 2a through 2c respectively show the implementation of (1) discrete III-V devices 30 2) integration of Si circuitry 40, with a discrete III-V device 30, and (3) integration of Si circuitry 40, GaAs circuitry 50, and a discrete III-V device 30.

It should be noted that the disclosed process produces truly selective growth. No unwanted deposition occurs on the SiO$_2$ mask and conversely growth occurs only on the exposed Si surface. This is important in that it simplifies the subsequent device fabrication process and improves device yields. The unwanted deposition does not have to be removed by a separate process step and any additional process step may produce a detrimental yield effect. It also reduces the probability of non-epitaxial deposition occurring on the exposed Si.

Equivalents

While the above described embodiments of the invention are preferred, other configurations will be readily apparent to those skilled in the art and thus the invention is only to be limited in scope by the language of the following claims and equivalents.

For example, the term Si substrate or wafer is intended to include a SOS (Silicon on Sapphire) substrate, or a Silicon on Insulator (Si on SiO$_2$ on Si) substrate. GaAs or other compound semiconductor LEDs, or other optoelectronic devices may be fabricated on the exposed Si surface, such as lasers or light detectors. Transistors, such as bipolar and Si MOSFETs may be fabricated on the Si surface. Devises such as metal semiconductor field effet transistors (MESFETs), modulation doped FETs (MODFETs), HEMTs, SDHT), heterojunction bipolar transistors (HBTs), heterojunction and quantum well lasers and LEDs may be formed on or in the GaAs. Trimethyl aluminum (TMA) may be added to the OMCVD reaction to produce AlGaAs films of any desired proportion. Triethyl gallium (TEG) and TEA may be substituted for TMG and TMA, respectively. Phosphine or Stibine may substitute for arsine.

Other lattice mismatched materials systems with technological importance to semiconductor technology are also applicable to this selective epitaxy process, including superconducting materials having high transition temperatures.

We claim:

1. A method of forming compound semiconductor material on selected areas of a Si substrate comprising the steps of:

(a) forming a protective layer of the Si substrate;

(b) forming openings through protective layer to form a patterned substrate of exposed regions on the surface of said Si substrate where the compound semiconductor material is to be formed;

(c) removing any remaining protective layer material at the openings by a wash solution followed by a rinse solution;

(d) removing any residual material from the exposed surfaces of the Si substrate;

(e) surface treating the patterned substrate by elevating the temperature thereof to again clean off the exposed Si surfaces just prior to deposition;

(f) depositing an initial thin layer of GaAs on the patterned substrate by OMCVD of arsine and gallium containing reactants at a low substrate temperature between about 350° to 450° C. and high arsine flow such that GaAs is expitaxially formed on the exposed Si surfaces and substantially no nucleation and, hence, no film formation, occurs on the protective layer surfaces.

(g) elevating the substrate temperature and continuing to grow epitaxial GaAs over the initially formed GaAs layer portions only.

2. The method of claim 1 including forming Si devices on the Si and compound semiconductor devices on the GaAs.

3. The method of claim 1 wherein the substrate comprises single crystal silicon, or silicon on sapphire, or silicon-on-insulator.

4. The method of claim 1 wherein the protective layer comprises a layer of $SiO_2$ or $Si_3N_4$.

5. The method of claim 1 wherein the protective layer comprises layers of $SiO_2$ and $Si_3N_4$.

6. The method of claim 1 wherein the compound semiconductor is GaAs or an alloy thereof.

7. The method of claim 6 wherein the compound semiconductor device is an optoelectronic device.

8. The method of claim 1 wherein the GaAs deposition is by OMCVD reaction of TMG or TEG.

9. The method of claim 1 wherein the wash solution is comprised of $H_2SO_4$ and $H_2O$ followed by a rinse and followed by HF and $H_2O$.

10. The method of claim 1 wherein step(e) comprises decomposing or dissolving any remaining protective layer or native oxide that may have formed on the Si surface.

11. The method of claim 10 wherein step(e) also includes atomic reconstruction of the Si surface.

12. The method of claim 1 wherein the OMCVD pressure during initial GaAs layer deposition is in the range of 10 to 100 Torr and a reactant flow of V/III material is established such that the ratio of arsenide source reactant to gallium source reactant is greater than 10.

* * * * *

UNITED STATES PATENT AND TRADEMARK OFFICE
CERTIFICATE OF CORRECTION

PATENT NO. : 4,826,784

DATED : May 2, 1989

INVENTOR(S) : Jack P. Salerno, et al

It is certified that error appears in the above-identified patent and that said Letters Patent is hereby corrected as shown below:

Claim 1, col. 5, line 11, after "through" insert --said--.

Signed and Sealed this

Sixteenth Day of January, 1990

Attest:

JEFFREY M. SAMUELS

Attesting Officer    Acting Commissioner of Patents and Trademarks